(12) United States Patent
Hare

(10) Patent No.: US 6,966,528 B1
(45) Date of Patent: Nov. 22, 2005

(54) HOLDER FOR ATTACHING A REMOTE CONTROL TO A PIECE OF FURNITURE

(76) Inventor: David Hare, 306 Kalmia Dr., Arlington, TX (US) 76018

( * ) Notice: Subject to any disclaimer, the term of this patent is extended or adjusted under 35 U.S.C. 154(b) by 375 days.

(21) Appl. No.: 10/244,255

(22) Filed: Sep. 16, 2002

(51) Int. Cl.⁷ .............................................. F16H 11/00
(52) U.S. Cl. .............................. 248/178.1; 248/184.1; 248/181.1
(58) Field of Search .......................... 248/178.1, 183.2, 248/184.1, 185.1, 181, 181.2, 179.1

(56) References Cited

U.S. PATENT DOCUMENTS

| | | | |
|---|---|---|---|
| 560,092 A * | 5/1896 | Ford et al. | |
| 2,318,910 A * | 5/1943 | Zucker | 248/183 |
| 2,650,788 A * | 9/1953 | Hulstein | 248/229 |
| 4,831,673 A | 5/1989 | Winckler | |
| 5,192,042 A | 3/1993 | Wotring et al. | |
| 5,195,634 A | 3/1993 | Zaug | |
| 5,207,791 A * | 5/1993 | Scherbarth | 273/148 B |
| 5,305,980 A | 4/1994 | Le Blanc | |
| 5,605,235 A | 2/1997 | Johnson | |
| 5,845,885 A * | 12/1998 | Carnevali | 248/118.1 |
| 5,954,208 A * | 9/1999 | Schultz | 211/13.1 |
| 6,220,556 B1 * | 4/2001 | Sohrt et al. | 248/279.1 |
| 6,378,815 B1 * | 4/2002 | Lee | 248/121 |

\* cited by examiner

*Primary Examiner*—Leslie A. Braun
*Assistant Examiner*—Steven Marsh
(74) *Attorney, Agent, or Firm*—Richard L Miller, P.C

(57) ABSTRACT

A holder for attaching a remote control to a piece of furniture. A bracket attaches to the piece of furniture and a platform is pivotally attached to the bracket and holds the remote control. The bracket includes a mounting plate, a stationary arm, and a movable arm. The platform has a lowermost surface which is concave allowing the platform to be used with remote controls having either flat or convex lower surfaces by merely inverting the platform accordingly, and a first portion of hook and loop fasteners screwed to the platform. A second portion of hook and loop fasteners is attached to the remote control and releasably engages with the first portion of hook and loop fasteners so as to releasably engage the remote control with the platform. A joint pivotally attaches the platform to the bracket and includes a pair of plates and a post with a second ball bearing and a screw boss.

7 Claims, 1 Drawing Sheet

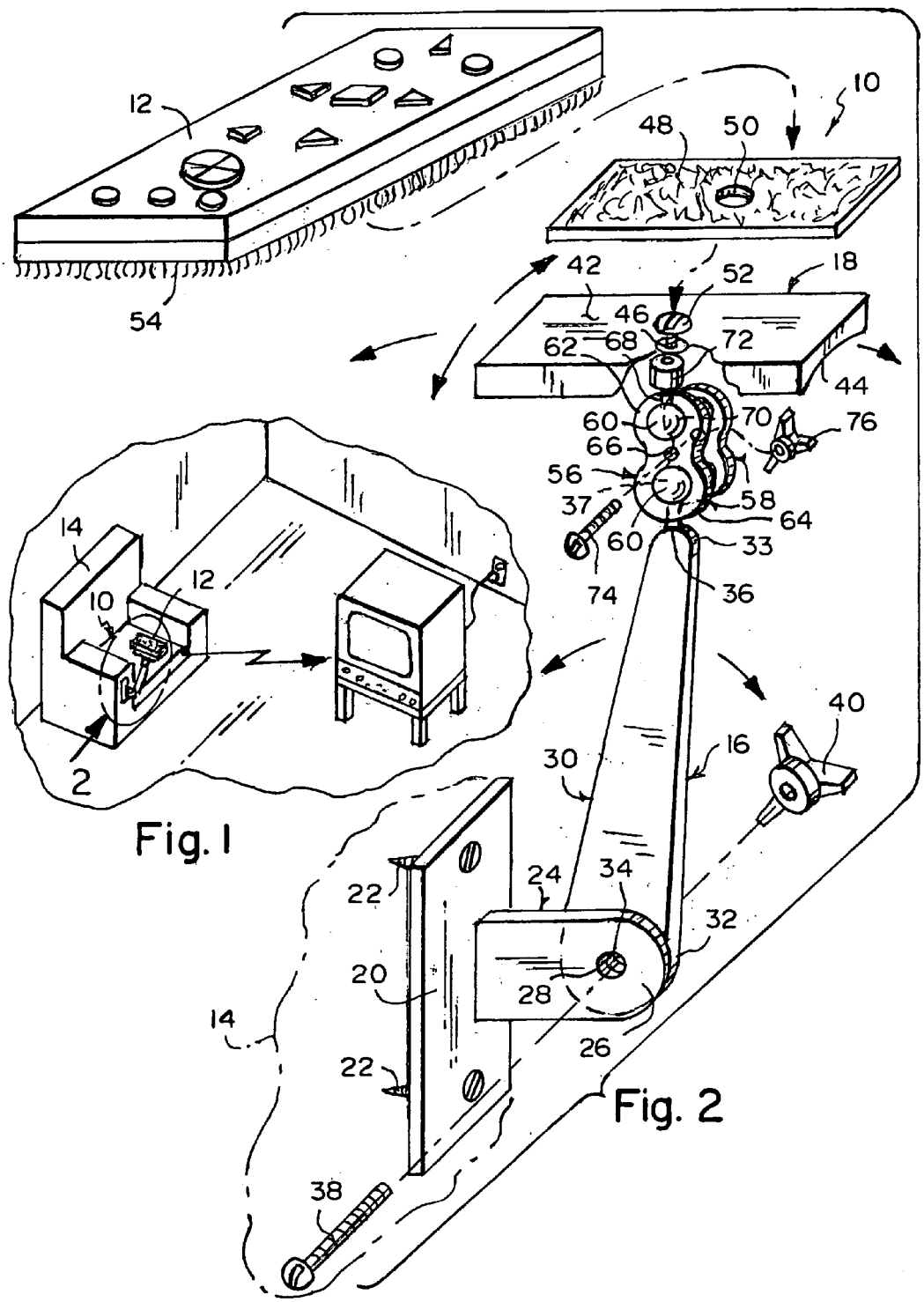

HOLDER FOR ATTACHING A REMOTE CONTROL TO A PIECE OF FURNITURE

BACKGROUND OF THE INVENTION

1. Field of the Invention

The present invention relates to a holder for attaching to a piece of furniture. More particularly, the present invention relates to a holder for attaching a remote control to a piece of furniture.

2. Description of the Prior Art

Numerous innovations for remote control holders have been provided in the prior art that will be described. Even though these innovations may be suitable for the specific individual purposes to which they address, however, they differ from the present invention.

A first example, U.S. Pat. No. 4,831,673 to Winckler teaches an apparatus for holding articles to a bed having a mattress, box spring and bed frame and consists of a receptacle member formed to back of a channel shaped clamp member that can be attached to side of the bed frame. The receptacle member has an open top to hold the article therein so that a person can remove the articles from the receptacle member when needed.

A second example, U.S. Pat. No. 5,192,042 to Wortring et al. teaches a holder for VCR and TV remote control units and other articles of like dimension in the form of a one-piece extrusion having a central web like panel with a predetermined length and thickness dimension adapted to removably receive thereon the unit or article to be held by the holder. The holder has a pair of side walls disposed in spaced apart parallel relationship connected to said web panel along the opposite longitudinal edges thereof. The central web is positioned approximately midway between the opposite longitudinal edges of each side wall such that the holder generally has an "H" configuration in transverse cross section. The side walls have their respective height dimensions, in a horizontal orientation of the center web, equal to one another and slightly greater than the maximum thickness dimension of the associated remote control unit or article to be held by the holder so that the same is nestable within the confines of receiving space defined by the side walls and center web panel. One of the side walls has a rib-like protrusion generally T-shaped in transverse cross section and extending longitudinally therealong and the other of the side walls has a channel-shaped protrusion extending longitudinally therealong and comprising mutually facing spaced apart pair of ribs having an L-shaped in transverse cross sections, the rib-like protrusion being endwise slidably internestable in the channel shaped protrusion of an associated second holder constructed in the same fashion.

A third example, U.S. Pat. No. 5,195,634 to Zaug teaches a holder which makes it more difficult to misplace remote control units. The holder includes an enclosure having a compartment for holding a remote control unit therein when the remote control unit is idle and a cover which may be opened so that the remote control unit may be removed from the compartment for use and may be returned to the compartment after use. An attaching mechanism connects the remote control unit to the enclosure so that the remote control unit cannot be separated from its holder. Since the enclosure is larger than the remote control unit, it is more difficult to misplace the enclosure containing the remote control unit than it is to misplace the remote control unit alone.

A fourth example, U.S. Pat. No. 5,305,980 to Le Blanc teaches a holder for a remote control device for controlling electronic equipment as television and video cassette recorders. The holder protects the device while permitting ready access to the control buttons. Full adjustability is provided to enable the holder to accommodate devices of different widths, lengths and thicknesses.

A fifth example, U.S. Pat. No. 5,605,235 to Johnson teaches a holder for a plurality of remote control devices for controlling audiovisual equipment. The holder has an upwardly open pocket sufficiently wide to hold at least two controllers abreast. A planar support arm extends upwardly from the pocket, and includes a horizontal extension. The horizontal extension is inserted below the cushion of a cushioned chair or sofa, or below the mattress of a bed. The holder is readily installed in and removed from the furniture. The holder engages the furniture without penetration thereof, alteration thereof, or permanent attachment thereto. The holder is thus conveniently, unobtrusively, accessibly, and visibly stored close at hand, without occupying horizontal table space or requiring a separate piece of furniture for secure storage.

It is apparent that numerous innovations for remote control holders have been provided in the prior art that are adapted to be used. Furthermore, even though these innovations may be suitable for the specific individual purposes to which they address, however, they would not be suitable for the purposes of the present invention as heretofore described.

SUMMARY OF THE INVENTION

Accordingly, an object of the present invention is to provide a holder for attaching a remote control to a piece of furniture that avoids the disadvantages of the prior art.

Another object of the present invention is to provide a holder for attaching a remote control to a piece of furniture that is simple and inexpensive to manufacture.

Still another object of the present invention is to provide a holder for attaching a remote control to a piece of furniture that is simple to use.

Brriefly stated, still yet another object of the present invention is to provide a holder for attaching a remote control to a piece of furniture. A bracket attaches to the piece of furniture and a platform is pivotally attached to the bracket and holds the remote control. The bracket includes a mounting plate, a stationary arm, and a movable arm. The platform has a lowermost surface which is concave allowing the platform to be used with remote controls having either flat or convex lower surfaces by merely inverting the platform accordingly, and a first portion of hook and loop fasteners screwed to the platform. A second portion of hook and loop fasteners is attached to the remote control and releasably engages with the first portion of hook and loop fasteners so as to releasably engage the remote control with the platform. A Joint pivotally attaches the platform to the bracket and includes a pair of plates and a post with a second ball bearing and a screw boss.

The novel features which are considered characteristic of the present invention are set forth in the appended claims. The invention itself, however, both as to its construction and its method of operation, together with additional objects and advantages thereof, will be best understood from the following description of the specific embodiments when read and understood in connection with the accompanying drawing.

BRIEF DESCRIPTION OF THE DRAWING

The figures of the drawing are briefly described as follows:

FIG. 1 is a diagrammatic perspective view of the present invention in use; and

FIG. 2 is an enlarged exploded diagrammatic perspective view of the area generally enclosed by the dotted curve identified by arrow 2 in FIG. 1 of the present invention.

LIST OF REFERENCE NUMERALS UTILIZED IN THE DRAWING 10 holder of present invention for attaching remote control 12 to piece of furniture 14
12 remote control
14 piece of furniture
16 bracket for attaching to piece of furniture 14
18 platform for holding remote control 12
20 mounting plate of bracket 16 for attaching to piece of furniture 14
22 screws of mounting plate 20 of bracket 16
24 stationary arm of bracket 16
26 terminal end of stationary arm 24 of bracket 16
28 through bore in terminal end 26 of stationary arm 24 of bracket 16
30 movable arm of bracket 16
32 proximal end of movable arm 30 of bracket 16
33 distal end of movable arm 30 of bracket 16
34 throughbore in proximal end 32 of movable arm 30 of bracket 16
36 post on distal end 33 of movable arm 30 of bracket 16
37 first ball bearing of post 36 on distal end 33 of movable arm 30 of bracket 16
38 first adjusting screw of bracket 16
40 first wing nut of bracket 16
42 uppermost surface of platform
44 lowermost surface of platform
46 through bore in platform 18
48 first portion of hook and loop fasteners of platform 18
50 through bore in first portion 48 of hook and loop fasteners of platform 18
52 screw of platform 18
54 second portion of hook and loop fasteners for attaching to remote control 12
56 joint
58 pair of plates of joint 56
60 facing ball bearing races in upper portions 62 of pair of plates 58 of joint 56 and lower portions 64 of pair of plates 58 of joint 56
62 upper portions of pair of plates 58 of joint 56
64 lower portions of pair of plates 58 of joint 56
66 through bores in pair of plates 58 of joint 56
68 post of joint 56
70 second ball bearing of post 68 of joint 56
72 screw boss of post 68 of joint 56
74 second adjusting screw of joint 56
76 second wing nut of bracket 56

DETAILED DESCRIPTION OF THE PREFERRED EMBODIMENT

Referring now to the figures, in which like numerals indicate like parts, and particularly to FIG. 1, the holder of the present invention is shown generally at 10 for attaching a remote control 12 to a piece of furniture 14.

The configuration of the holder 10 can best be seen in FIG. 2, and as such, will be discussed with reference thereto.

The holder 10 comprises a bracket 16 and a platform 18. The bracket 16 is for attaching to the piece of furniture 14 and the platform 18 is pivotally attached to the bracket 16 and is for holding the remote control 12.

The bracket 16 comprises a mounting plate 20 for attaching to the piece of furniture 14 by screws 22.

The bracket 16 further comprises a stationary arm 24. The stationary arm 24 of the bracket 16 extends outwardly from the mounting plate 20 thereof to a terminal end 26. The terminal end 26 of the stationary arm 24 of the bracket 16 has a through bore 28 that extends laterally therethrough.

The bracket 16 further comprises a movable arm 30. The movable arm 30 of the bracket 16 is pivotally attached to the stationary arm 24 thereof.

The movable arm 30 of the bracket 16 has a proximal end 32 and a distal end 33. The proximal end 32 of the movable arm 30 of the bracket 16 has a throughbore 34 that extends laterally therethrough. The distal end 33 of the movable arm 30 of the bracket 16 has a post 36 that extends coaxially therefrom and which terminates in a first ball bearing 37.

The bracket 16 further comprises a first adjusting screw 38. The first adjusting screw 38 of the bracket 16 extends into the through bore 28 in the stationary arm 24 of the bracket 16 and threadably into a first wing nut 40 so as to allow the moveable arm 30 to pivot relative to the stationary arm 28 to a desired position and be maintained thereat by tightening the first wing nut 40.

The platform 18 has an uppermost surface 42, a lowermost surface 44, and a through bore 46. The through bore 46 in the platform 18 extends centrally therethrough from the uppermost surface 42 thereof to the lowermost surface 44 thereof.

The lowermost surface 44 of the platform 18 is concave for allowing the platform 18 to be used with remote controls 12 having either flat or convex lower surfaces by merely inverting the platform 18 accordingly.

The platform 18 further has a first portion of hook and loop fasteners 48. The first portion of hook and loop fasteners 48 of the platform 18 has a through bore 50. The through bore 50 in the first portion of hook and loop fasteners 48 of the platform 18 extends centrally and axially therethrough and is aligned with the through bore 46 in the platform 18.

The platform 18 further has a screw 52. The screw 52 enters the through bore 50 in the first portion of hook and loop fasteners 48 of the platform 18 and the through bore 46 in the platform 18 so as to position the first portion of hook and loop fasteners 48 of the platform 18 on the platform 18.

The holder 10 further comprises a second portion of hook and loop fasteners 54. The second portion of hook and loop fasteners 54 is for attaching to the remote control 12 and releasably engages with the first portion of hook and loop fasteners 48 of the platform 18 for releasably engaging the remote control 12 with the platform 18.

The holder 10 further comprises a joint 56. The joint 56 pivotally attaches the platform 18 to the bracket 16. The joint 56 comprises a pair of plates 58. The pair of plates 58 of the joint 56 have facing ball bearing races 60 in upper portions 62 thereof and lower portions 64 thereof.

The facing ball bearing races 60 in the lower portions 64 of the pair of plates 58 of the joint 56 capture the first ball bearing 37 of the bracket 16 therebetween.

The pair of plates 58 of the joint 56 further have through bores 66. The through bores 66 in the pair of plates 58 of the joint 56 extend laterally therethrough, are aligned with each other, and are disposed between the upper portions 62 thereof and the lower portions 64 thereof.

The joint 56 further comprises a post 68. The post 68 of the joint 56 has a lowermost end with a second ball bearing 70 thereon. The second ball bearing 70 of the joint 56 is captured between the facing ball bearing races 60 in the upper portions 62 of the pair of plates 58 of the joint 56.

The post 68 of the joint 56 further has an uppermost end with a screw boss 72 coaxially thereat. The screw boss 72 of the post 68 of the joint 56 threadably receives the screw 52 of the platform 18.

The joint 56 further comprises a second adjustment screw 74. The second adjusting screw 74 of the joint 56 extends into the through bores 66 in the pair of plates 58 of the joint 56 and threadably into a second wing nut 76 so as to allow the platform 18 to pivot relative to the bracket 16 to a desired position and be maintained thereat by tightening the second wing nut 76.

It will be understood that each of the elements described above, or two or more together, may also find a useful application in other types of constructions differing from the types described above.

While the invention has been illustrated and described as embodied in a holder for attaching a remote control to a piece of furniture, however, it is not limited to the details shown, since it will be understood that various omissions, modifications, substitutions and changes in the forms and details of the device illustrated and its operation can be made by those skilled in the art without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute characteristics of the generic or specific aspects of this invention.

The invention claimed is:

1. A holder for attaching a remote control to a piece of furniture, comprising:
   a) a bracket;
   b) a platform; and
   c) a joint;
   wherein said bracket is for attaching to the piece of furniture;
   wherein said platform is pivotally attached to said bracket;
   wherein said platform is for holding the remote control;
   wherein said bracket comprises a mounting plate;
   wherein said mounting plate of said bracket is for attaching to the piece of furniture by screws;
   wherein said bracket comprises a stationary arm;
   wherein said stationary arm of said bracket extends outwardly from said mounting plate thereof to a terminal end;
   wherein said terminal end of said stationary arm of said bracket has a through bore;
   wherein said through bore in said terminal end of said stationary arm of said bracket extends laterally therethrough;
   wherein said bracket comprises a movable arm;
   wherein said movable arm of said bracket is pivotally attached to said stationary arm thereof;
   wherein said movable arm of said bracket has a proximal end;
   wherein said movable arm of said bracket has a distal end;
   wherein said proximal end of said movable arm of said bracket has a through bore;
   wherein said through bore in said proximal end of said movable arm of said bracket extends laterally therethrough;
   wherein said distal end of said movable arm of said bracket has a post;
   wherein said post of said distal end of said movable arm of said bracket extends coaxially therefrom;
   wherein said post of said distal end of said movable arm of said bracket terminates in a first ball bearing;
   wherein said platform has an uppermost surface;
   wherein said platform has a lowermost surface;
   wherein said platform has a through bore;
   wherein said through bore in said platform extends centrally therethrough from said uppermost surface thereof to said lowermost surface thereof;
   wherein said platform has a first portion of hook and loop fasteners;
   wherein said first portion of hook and loop fasteners of said platform has a through bore;
   wherein said through bore in said first portion of hook and loop fasteners of said platform extends centrally and axially therethrough;
   wherein said through bore in said first portion of hook and loop fasteners of said platform is aligned with said through bore in said platform;
   wherein said platform has a screw;
   wherein said screw enters said through bore in said first portion of hook and loop fasteners of said platform and said through bore in said platform so as to position said first portion of hook and loop fasteners of said platform on said platform;
   wherein said joint pivotally attaches said platform to said bracket;
   wherein said joint comprises a pair of plates;
   wherein said pair of plates of said joint have facing ball bearing races in upper portions thereof and lower portions thereof;
   wherein said joint comprises a post;
   wherein said post of said joint has a lowermost end with a second ball bearing thereon;
   wherein said second ball bearing of said joint is captured between said facing ball bearing races in said upper portions of said pair of plates of said joint;
   wherein said post of said joint has an uppermost end with a screw boss coaxially thereat; and
   wherein said screw boss of said cost of said joint threadably receives said screw of said platform.

2. The holder as defined in claim 1, wherein said bracket comprises a first adjusting screw; and wherein said first adjusting screw of said bracket extends into said through bore in said stationary arm of said bracket and threadably into a first wing nut so as to allow said moveable arm to pivot relative to said stationary arm to a desired position and be maintained thereat by tightening said first wing nut.

3. The holder as defined in claim 1, wherein said lowermost surface of said platform is concave for allowing said platform to be used with remote controls having either flat or convex lower surfaces by merely inverting said platform accordingly.

4. The holder as defined in claim 1; further comprising a second portion of hook and loop fasteners;
   wherein said second portion of hook and loop fasteners is for attaching to the remote control; and wherein said second portion of hook and loop fasteners releasably engages with said first portion of hook and loop fasteners of said platform for releasably engaging the remote control with said platform.

5. The holder as defined in claim 1, wherein said facing ball bearing races in said lower portions of said pair of plates of said joint capture said first ball bearing of said bracket therebetween.

6. The holder as defined in claim 1, wherein said pair of plates of said joint have through bores;
 wherein said through bores in said pair of plates of said joint extend laterally therethrough;
 wherein said through bores in said pair of plates of said joint are aligned with each other; and
 wherein said through bores in said pair of plates of said joint are disposed between said upper portions thereof and said lower portions thereof.

7. The holder as defined in claim 6, wherein said joint comprises a second adjustment screw; and wherein said second adjusting screw of said joint extends into said through bores in said pair of plates of said joint and threadably into a second wing nut so as to allow said platform to pivot relative to said bracket to a desired position and be maintained thereat by tightening said second wing nut.

* * * * *